(12) United States Patent
Song et al.

(10) Patent No.: US 8,953,403 B1
(45) Date of Patent: Feb. 10, 2015

(54) SEMICONDUCTOR MEMORY DEVICE

(71) Applicant: SK hynix Inc., Gyeonggi-do (KR)

(72) Inventors: Choung-Ki Song, Gyeonggi-do (KR);
Young-Do Hur, Gyeongggi-do (KR);
Tae-Woo Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/096,801

(22) Filed: Dec. 4, 2013

(30) Foreign Application Priority Data

Aug. 9, 2013 (KR) .......................... 10-2013-0094525

(51) Int. Cl.
| G11C 11/402 | (2006.01) |
| G11C 11/406 | (2006.01) |
| G11C 8/12 | (2006.01) |
| G11C 11/408 | (2006.01) |
| G11C 7/04 | (2006.01) |
| G11C 8/10 | (2006.01) |

(52) U.S. Cl.
CPC ............ G11C 7/04 (2013.01); *G11C 11/40618* (2013.01); G11C 11/406 (2013.01); *G11C 8/12* (2013.01); *G11C 8/10* (2013.01); *G11C 11/408* (2013.01)
USPC ........................ 365/222; 365/230.03; 365/236

(58) Field of Classification Search
CPC ........... G11C 11/406; G11C 11/40618; G11C 11/408; G11C 8/12; G11C 8/10
USPC ..................................... 365/222, 230.03, 236
See application file for complete search history.

(56) References Cited

U.S. PATENT DOCUMENTS

| 6,967,885 B2 * | 11/2005 | Barth et al. ................... 365/222 |
| 7,688,662 B2 * | 3/2010 | Mobley ......................... 365/222 |
| 2005/0243627 A1 * | 11/2005 | Lee et al. ...................... 365/222 |
| 2006/0044912 A1 * | 3/2006 | Kim et al. ..................... 365/222 |
| 2007/0133330 A1 * | 6/2007 | Ohsawa ........................ 365/222 |
| 2009/0106503 A1 * | 4/2009 | Lee et al. ...................... 711/149 |
| 2011/0085398 A1 * | 4/2011 | Roy .............................. 365/222 |
| 2011/0141836 A1 | 6/2011 | Luthra et al. |
| 2014/0064008 A1 * | 3/2014 | Lee ............................... 365/222 |

FOREIGN PATENT DOCUMENTS

KR 1020120059097 6/2012

* cited by examiner

*Primary Examiner* — Ly D Pham
(74) *Attorney, Agent, or Firm* — IP & T Group LLP

(57) ABSTRACT

A semiconductor memory device includes a plurality of banks; a counting block suitable for counting the activation number of the respective banks, and selecting a bank of which the activation number is larger than or equal to a given number; and a refresh control block suitable for performing a normal refresh operation on the banks in response to a refresh command, and performing an additional refresh operation N times on the selected bank, N being a positive integer.

14 Claims, 12 Drawing Sheets

SEMICONDUCTOR MEMORY DEVICE

CROSS-REFERENCE TO RELATED APPLICATIONS

The present application claims priority of Korean Patent Application No. 10-2013-0094525, filed on Aug. 9, 2013, which is incorporated herein by reference in its entirety.

BACKGROUND

1. Field

Exemplary embodiments of the present invention relate to a semiconductor design technology, and more particularly, to a semiconductor memory device and a method of operating the same.

2. Description of the Related Art

As the integration degree of a memory increases, a distance between a plurality of word lines included in the memory is reduced. As the distance between the word lines is reduced, a coupling effect between adjacent word lines increases.

Whenever data is inputted or outputted to or from a memory cell, a word line toggles between an active state and a deactive state. Therefore, as the coupling effect between adjacent word lines increases, the data of a memory cell connected with a word line adjacent to a frequently activated word line may be degraded. This is termed word line disturbance or word line hammer. Due to the word line disturbance, the data of a memory cell may be degraded within an expected retention time of the memory cell to be refreshed.

FIG. 1 is a diagram illustrating a part of a cell array included in a semiconductor memory device for describing word line disturbance.

Referring to FIG. 1, 'WLL' corresponds to a frequently activated word line, which has a larger activation number or a higher activation frequency, and 'WLL−1' and 'WLL+1' correspond to adjacent word lines, which are disposed adjacent to the frequently activated word line WLL. Furthermore, 'CL' denotes a memory cell connected with the frequently activated word line WLL, 'CL−1' indicates a memory cell connected with the adjacent word line WLL−1, and 'CL+1' indicates a memory cell connected with the adjacent word line WLL+1. The memory cells CL, CL−1 and CL+1 include cell transistors TL, TL−1 and TL+1 and cell capacitors CAPL, CAPL−1 and CAPL+1, respectively. For reference, 'BL' and 'BL+1' denote bit lines.

When the frequently activated word line WLL is activated or deactivated, the voltages of the adjacent word lines WLL−1 and WLL+1 are increased or decreased due to a coupling phenomenon occurring among the word lines WLL, WLL−1 and WLL+1. Accordingly, the amount of charges charged in the cell capacitors CAPL−1 and CAPL+1 is affected so that the data of the memory cells CL−1 and the CL+1 may be degraded.

Furthermore, as electromagnetic waves, which are generated while the word line toggles between the activated state and the deactivated state, introduce/discharge electrons into/from the cell capacitors of the memory cells connected with adjacent word lines, data may likely be degraded.

SUMMARY

Various exemplary embodiments are directed to a semiconductor memory device and a method of operating the same, capable of preventing data of memory cells from being degraded due to word line disturbance, by performing an additional refresh operation along with a normal refresh operation to be performed in response to a refresh command on a bank including a word line with a larger activation number.

Also, various exemplary embodiments are directed to a semiconductor memory device and a method of operating the same, capable of reducing current amount consumed due to an additional refresh operation, by performing an additional refresh operation on a selected bank that includes a word line with a larger activation number while a normal refresh operation is performed for the remaining banks.

In an exemplary embodiment, a semiconductor memory device may include: a plurality of banks; a counting block suitable for counting the activation number of the respective banks, and selecting a bank having the activation number larger than or equal to a given number; and a refresh control block suitable for performing a normal refresh operation on the banks in response to a refresh command, and performing an additional refresh operation N times on the selected bank, N being a positive integer.

In an exemplary embodiment, a semiconductor memory device may include: M number of bank groups grouped by dividing K number of banks by a predefined number, M and K being a positive integer; a counting block suitable for counting and summing the activation number of the respective banks in units of the respective bank groups, and selecting a bank group whose activation number is larger than or equal to a predetermined number; and a refresh control block suitable for performing a normal refresh operation on the bank groups in response to a refresh command, and performing an additional refresh operation N times on the selected bank group, N being a positive integer.

In an exemplary embodiment, a method for operating a semiconductor memory device including a plurality of banks may include: counting the activation number of the respective banks; selecting a bank having the activation number larger than or equal to a given number in response to a counting result; performing a normal refresh operation on the banks in response to a refresh command; and performing an additional refresh operation N times following the normal refresh operation, on the selected bank before a next refresh command is applied, N being a positive integer.

The method may further comprise: counting the number of times by which the normal refresh operation is performed on the selected bank; and initializing the selecting a bank when the input number of the refresh command to the selected bank reaches a preselected number.

The selecting a bank may be individually performed on the respective banks, and when plural banks are selected, the initializing may be individually performed for the selected banks.

In an exemplary embodiment, a method for operating a semiconductor memory device including M number of bank groups which are defined through dividing K number of banks by a predefined number may include: counting and summing the activation number of the respective banks in units of the respective bank groups; selecting a bank group whose activation number is larger than or equal to a predetermined number based on the counting; performing a normal refresh operation on the bank groups in response to a refresh command; and performing an additional refresh operation N times following the normal refresh operation, on the selected bank group before a next refresh command is applied, N being a positive integer.

The method may further comprise: counting the number of times by which the normal refresh operation is performed on the selected bank group; and initializing the selecting a bank group when the input number of the refresh command inputted to the selected bank group reaches a preselected number.

The selecting a bank may be individually performed on the respective bank groups, the number of bank groups, and when plural bank groups are selected, the initializing may be individually performed on the selected bank groups.

According to the above exemplary embodiments, an additional refresh operation may be performed along with a normal refresh operation to be performed in response to a refresh command on a bank including a word line with a larger activation number or a higher activation frequency. Accordingly, it may be possible to substantially prevent the data of memory cells from being degraded due to word line disturbance.

Also, according to the above exemplary embodiments, an additional refresh operation may be performed by selecting only a bank including a word line with a larger activation number or a higher activation frequency while only a normal refresh operation is performed on the remaining banks. Accordingly, it may be possible to reduce the magnitude of current consumed due to the additional refresh operation.

DETAILED DESCRIPTION

Figure 1:
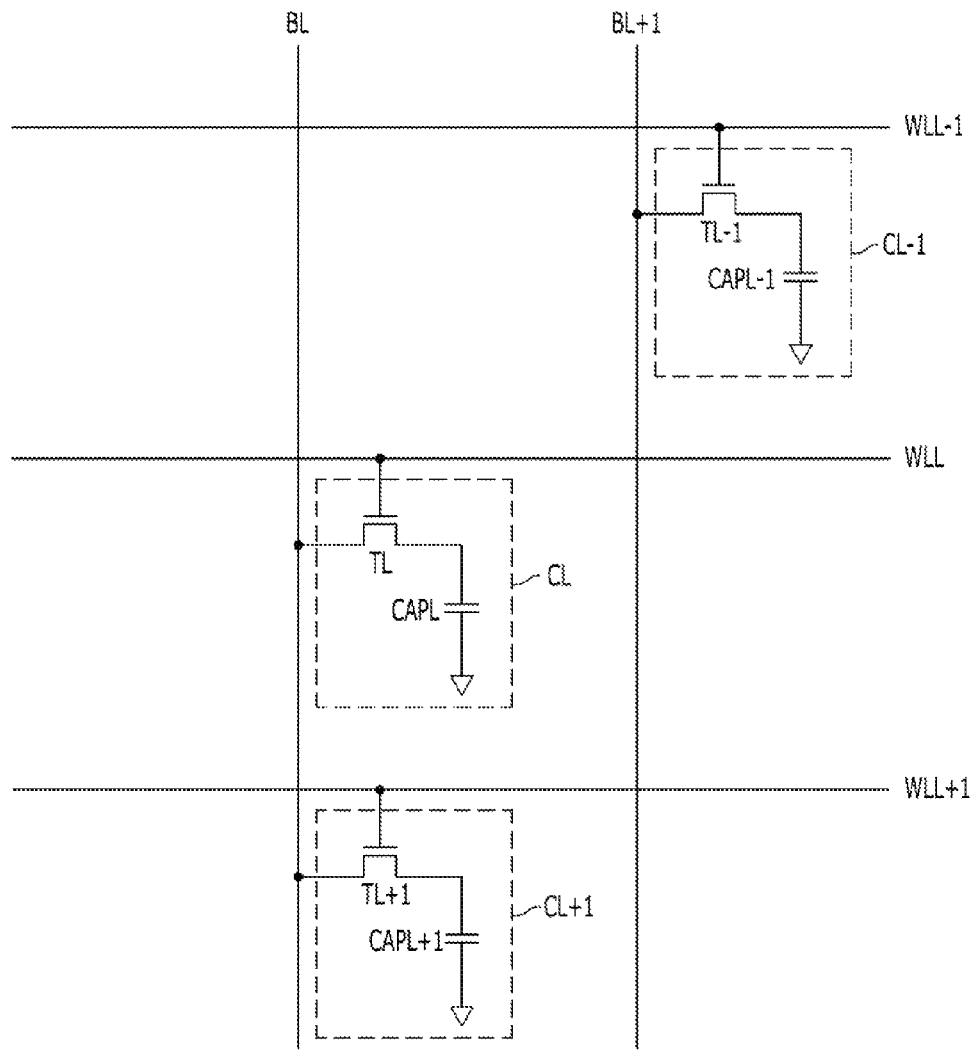
FIG. 1 is a diagram illustrating a part of a cell array included in a semiconductor memory device for describing word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
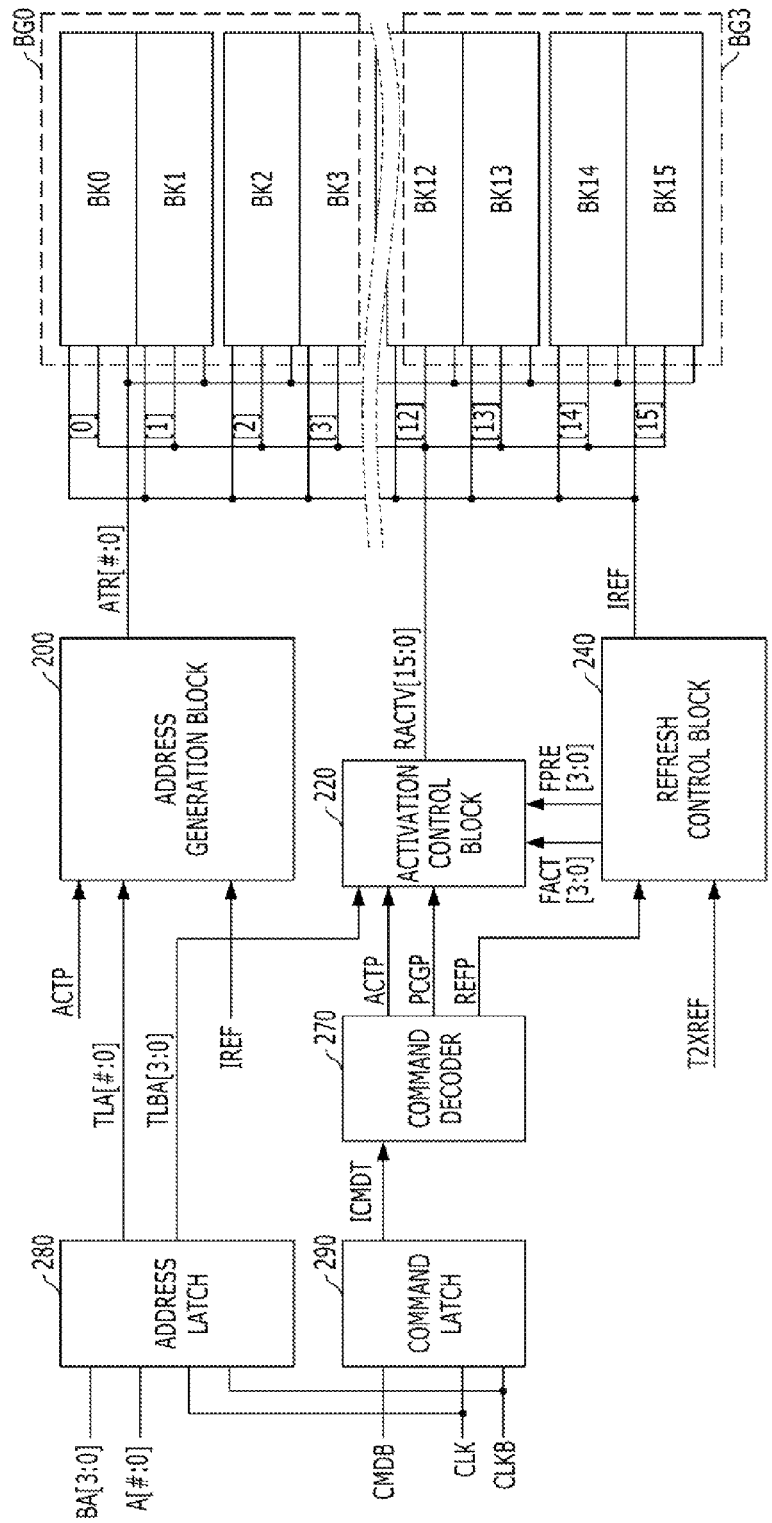
FIG. 2 is a block diagram illustrating a semiconductor memory device in accordance with an exemplary embodiment of the present invention.

FIG. 2 is a block diagram illustrating a semiconductor memory device in accordance with an exemplary embodiment of the present invention.

Referring to FIG. 2, the semiconductor memory device includes first to fourth bank groups BG0 to BG3, an address generation block 200, an activation control block 220, a refresh control block 240, a command decoder 270, an address latch 280, and a command latch 290.

Respective fours of banks BK0, BK1, BK2, BK3, ..., BK12, BK13, BK14 and BK15 are included in the respective bank groups BG0 to BG3. That is, the first to fourth bank groups BG0 to BG3 are defined by dividing 16 banks BK0, BK1, BK2, BK3, ..., BK12, BK13, BK14 and BK15 by 4. For reference, the 16 banks in the drawing are shown for the sake of illustration purposes; however, more or less banks may be included in the bank groups. The first to fourth bank groups which are defined by grouping 16 banks into 4 bank groups are shown for the sake of illustration purposes, however, more or less banks may be included in 1 bank group therefore the number of bank groups may be changed in a variety of ways. For reference, in the exemplary embodiment of the semiconductor memory device, it is presumed that, as shown in FIG. 2, the first to fourth bank groups BG0 to BG3 are defined in units of 4 banks, and thus a total 16 banks BK0, BK1, BK2, BK3, ..., BK12, BK13, BK14 and BK15 are disposed in the first to fourth bank groups BG0 to BG3.

Clock signals CLK and CLKB inputted from outside of the semiconductor memory device are buffered and outputted to the command latch 290 and the address latch 280.

The address latch 280 buffers and latches a bank address BA[3:0] and a row address A[#:0] inputted from the outside of the semiconductor memory device in response to the clock signals CLK and CLKB, and outputs a bank address TLBA[3:0] and a row address TLA[#:0].

The address generation block 200 receives the row address TLA[#:0], and selects a plurality of word lines (not shown) included in the 16 banks BK0 to BK15 based on the row address TLA[#:0]. The activation control block 220 receives the bank address TLBA[3:0], and selects any one of the 16 banks BK0 to BK15 based on the bank address TLBA[3:0].

The command latch 290 buffers and latches a command signal CMDB inputted from the outside of the semiconductor memory device in response to the clock signals CLK and CLKB, and outputs an internal command signal ICMDT.

The command decoder 270 decodes the internal command signal ICMDT latched by the command latch 290, and generates an active command ACTP, a precharge command PCGP and a refresh command REFP.

The active command ACTP generated by the command decoder 270 is inputted to the activation control block 220 and the address generation block 200, and is used to activate the 16 banks BK0 to BK15. The precharge command PCGP is inputted to the activation control block 220, and is used to precharge the 16 banks BK0 to BK15. The refresh command REFP is inputted to the refresh control block 240, and is used to refresh the 16 banks BK0 to BK15.

The address generation block 200 generates an internal row address ATR[#:0] for selecting any one of the word lines included in each of the 16 banks BK0 to BK15, based on the row address TLA[#:0] when the active command ACTP is applied. Additionally, the address generation block 200 generates the internal row address ATR[#:0] for selecting any one of word lines included in each of the 16 banks BK0 to BK15, by internally generating addresses to be used to refresh when a refresh operation signal IREF corresponding to the refresh command REFP is applied.

The activation control block 220 activates any one of the 16 banks BK0 to BK15 in response to the active command ACTP and the bank address TLBA[3:0], and precharges any one of the 16 banks BK0 to BK15 in response to the precharge command PCGP and the bank address TLBA[3:0]. Since a bank to be activated and a bank to be precharged are selected based on the same bank address TLBA[3:0], an active operation and a precharge operation are performed together on each bank. Further, the activation control block 220 activates the 16 banks BK0 to BK15 in units of the bank groups BG0 to BG3 in response to a refresh active command FACT[3:0], and precharges the 16 banks BK0 to BK15 in units of the bank groups BG0 to BG3 in response to a refresh precharge command FPRE[3:0]. Since the refresh active command FACT[3:0] and the refresh precharge command FPRE[3:0] are respectively activated in a preset order in response to the refresh command REFP, a refresh active operation and a refresh precharge operation are performed together on each bank. The activation control block 220 may generate active signals RACTV[15:0] for determining whether to activate the respective 16 banks BK0 to BK15 in response to the bank address TLBA[3:0], the active command ACTP, the precharge command PCGP, the refresh active command FACT[3:0] and the refresh precharge command FPRE[3:0].

The refresh control block 240 generates and outputs the refresh operation signal IREF to the 16 banks BK0 to BK15 and the address generation block 200 in response to the refresh command REFP, such that any one of word lines included in each of the 16 banks BK0 to BK15 may be selected for a refresh operation. Additionally, the refresh control block 240 generates and outputs the refresh active command FACT[3:0] and the refresh precharge command FPRE[3:0] to the activation control block 220 in response to the refresh command REFP, such that the 16 banks BK0 to BK15 may be activated and precharged in units of 4 banks corresponding to each of the first to fourth bank groups BG0 to BG3.

The number of times by which the refresh active command FACT[3:0] and the refresh precharge command FPRE[3:0] are generated in response to one refresh command REFP may be changed in response to an additional refresh signal T2XREF which is applied to the refresh control block 240. For example, in the state where the additional refresh signal T2XREF is deactivated, the refresh control block 240 generates the refresh active command FACT[3:0] and the refresh precharge command FPRE[3:0] once in response to one refresh command REFP, such that the 16 banks BK0 to BK15 may be activated and precharged once in units of 4 banks. Conversely, in the state where the additional refresh signal T2XREF is activated, the refresh control block 240 generates the refresh active command FACT[3:0] and the refresh precharge command FPRE[3:0] at least twice in response to one refresh command REFP, such that the 16 banks BK0 to BK15 may be activated and precharged at least twice in units of 4 banks.

Figure 3:
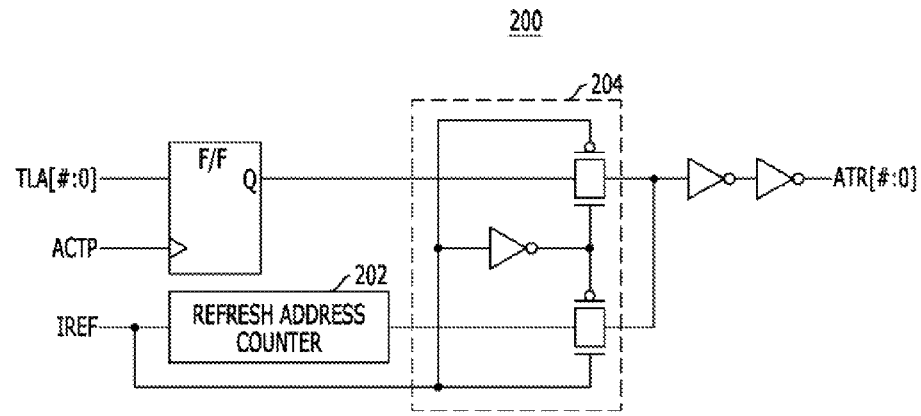
FIG. 3 is a detailed block diagram illustrating an address generation block shown in FIG. 2.

FIG. 3 is a detailed block diagram illustrating the address generation block 200 shown in FIG. 2.

Referring to FIG. 3, the address generation block 200 includes a flip-flop F/F, a refresh address counter 202, and an address selection unit 204.

The flip-flop F/F receives the row address TLA[#:0] and outputs the internal row address ATR[#:0] in synchronization with the active command ACTP. That is, the flip-flop F/F outputs the row address TLA[#:0] as the internal row address ATR[#:0] when the active command ACTP is applied.

The refresh address counter 202 counts a refresh address to output the internal row address ATR[#:0] in response to the refresh operation signal IREF corresponding to the refresh command REFP. The refresh address is set in the refresh address counter 202 in advance. That is, the refresh address counter 202 outputs the Internal row address ATR[#:0] which is sequentially generated by a counting operation when the refresh operation signal IREF is applied.

The address selection unit 204 selects one of the internal row address ATR[#:0] outputted from the flip-flop F/F, and the internal row address ATR[#:0] generated by the refresh address counter 202, in response to the refresh operation signal IREF corresponding to the refresh command REFP. That is, when a refresh operation is to be performed when the refresh operation signal IREF corresponding to the refresh command REFP is applied, the address selection unit 204 selects and outputs the internal row address ATR[#:0] generated by the refresh address counter 202. In a normal operation period in which the refresh operation signal IREF corresponding to the refresh command REFP is not applied, the address selection unit 204 selects and outputs the internal row address ATR[#:0] outputted from the flip-flop F/F.

Figure 4:
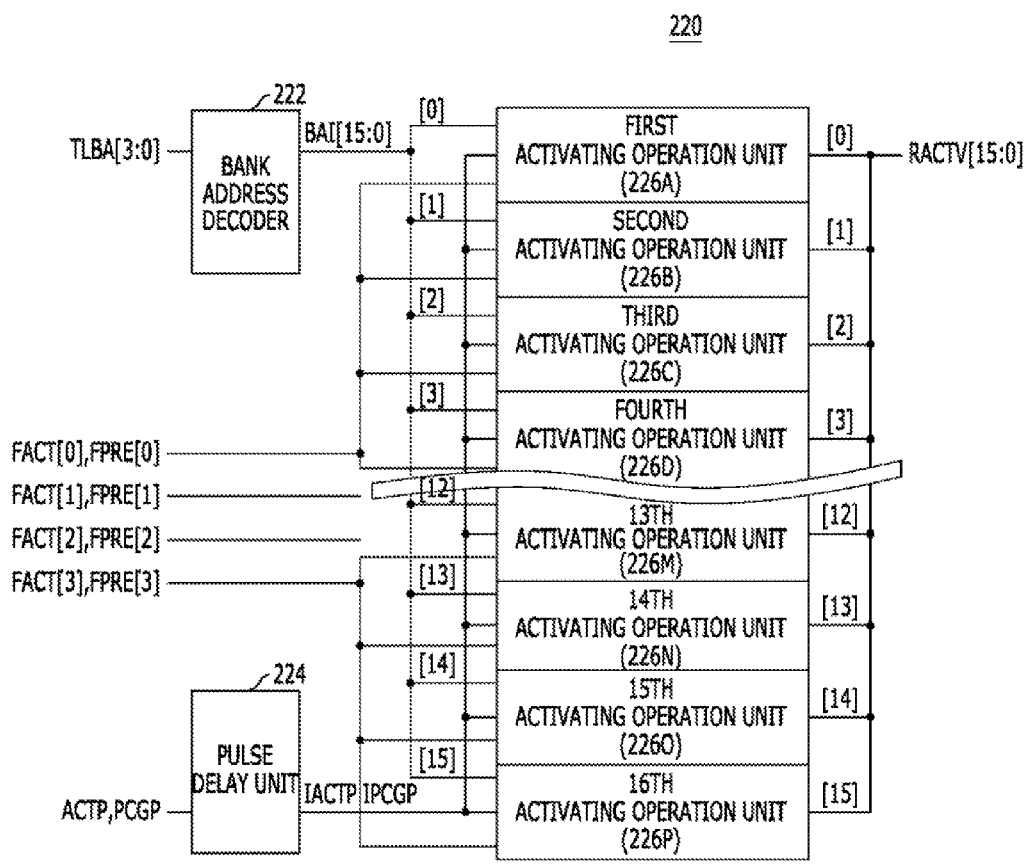
FIG. 4 is a detailed block diagram illustrating an activation control block shown in FIG. 2.

FIG. 4 is a detailed block diagram illustrating the activation control block 220 shown in FIG. 2.

Referring to FIG. 4, the activation control block 220 includes a bank address decoder 222, a pulse delay unit 224, and first to sixteenth active operation units 226A, 226B, 226C, 226D, . . . , 226M, 226N, 226O and 226P.

The bank address decoder 222 decodes the bank address TLBA[3:0] and generates internal bank address BAI[15:0]. The internal bank address BAI[15:0] is used to select any one of the first to sixteenth active operation units 226A to 226P.

The pulse delay unit 224 delays the active command ACTP and the precharge command PCGP by a preset time and outputs an internal active command IACTP and an internal precharge command IPCGP. The preset time is a time that is required for a decoding operation of the bank address decoder 222. That is, the Internal bank address BAI[15:0] outputted from the bank address decoder 222, and the internal active command IACTP and internal precharge command IPCGP outputted from the pulse delay unit 224 reach the first to sixteenth active operation units 226A to 226P at the same time.

The first to sixteenth active operation units 226A to 226P generate the active signals RACTV[15:0] which are activated in response to the internal active command IACTP and are deactivated in response to the internal precharge command IPCGP. While the internal active command IACTP and the internal precharge command IPCGP are commonly inputted to the first to sixteenth active operation units 226A to 226P, only one of the first to sixteenth active operation units 226A to 226P is selected and activated since the internal bank address BAI[15:0] are simultaneously applied to the first to sixteenth active operation units 226A to 226P. The first to sixteenth active operation units 226A to 226P generate the active signals RACTV[15:0] which are activated in units of the bank groups BG0 to BG3 in response to the refresh active command FACT[3:0], and are deactivated in units of the bank groups BG0 to BG3 in response to the refresh precharge command FPRE[3:0]. For example, if a second bit FACT[1] of the refresh active command FACT[3:0] and a second bit FPRE[1] of the refresh precharge command FPRE[3:0] toggle with a predetermined time difference, only the 4 active signals RACTV[4], RACTV[5], RACTV[6] and RACTV[7] outputted from the fifth to eighth active operation units 226E, 226F, 226G, 226H belonging to the second bank group BG1 are activated in response to the second bits and deactivated after a predetermined time.

Figure 5:
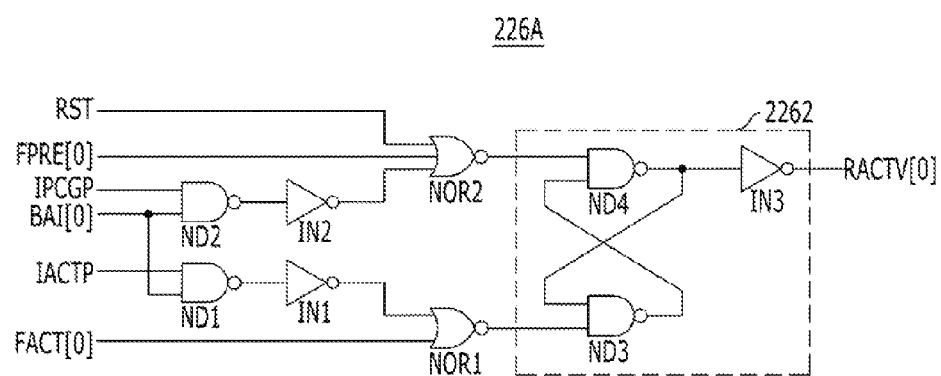
FIG. 5 is a circuit diagram illustrating each active operation unit shown in FIG. 4.

FIG. 5 is a circuit diagram illustrating the first active operation unit 226A shown in FIG. 4. Since the second to sixteenth active operation units 226B to 226P have substantially the same structures as that of the first active operation unit 226A, the first delay active operation unit 226A is described in FIG. 5 as an example.

Referring to FIG. 5, the first active operation unit 226A includes a first NAND gate ND1 and a first inverter IN1 which are connected in series to perform an AND operation on the internal active command IACTP and a corresponding internal bank address BAI[0], a first NOR gate NOR1 to perform a NOR operation on an output signal of the first inverter IN1 and a corresponding refresh active command FACT[0], a second NAND gate ND2 and a second inverter IN2 which are connected in series to perform an AND operation on the internal precharge command IPCGP and the corresponding internal bank address BAI[0], a second NOR gate NOR2 to perform a NOR operation on an output signal of the second inverter IN2, a corresponding refresh precharge command FPRE[0] and a reset signal RST, and an RS flip-flop 2262 which receives an output signal of the first NOR gate NOR1 through a set terminal, receives an output signal of the second NOR gate NOR2 through a reset terminal, and determines whether to activate a corresponding active signal RACTV[0]. The RS flip-flop 2262 includes third and fourth NAND gates ND3 and ND4 and a third inverter IN3.

Figure 6:
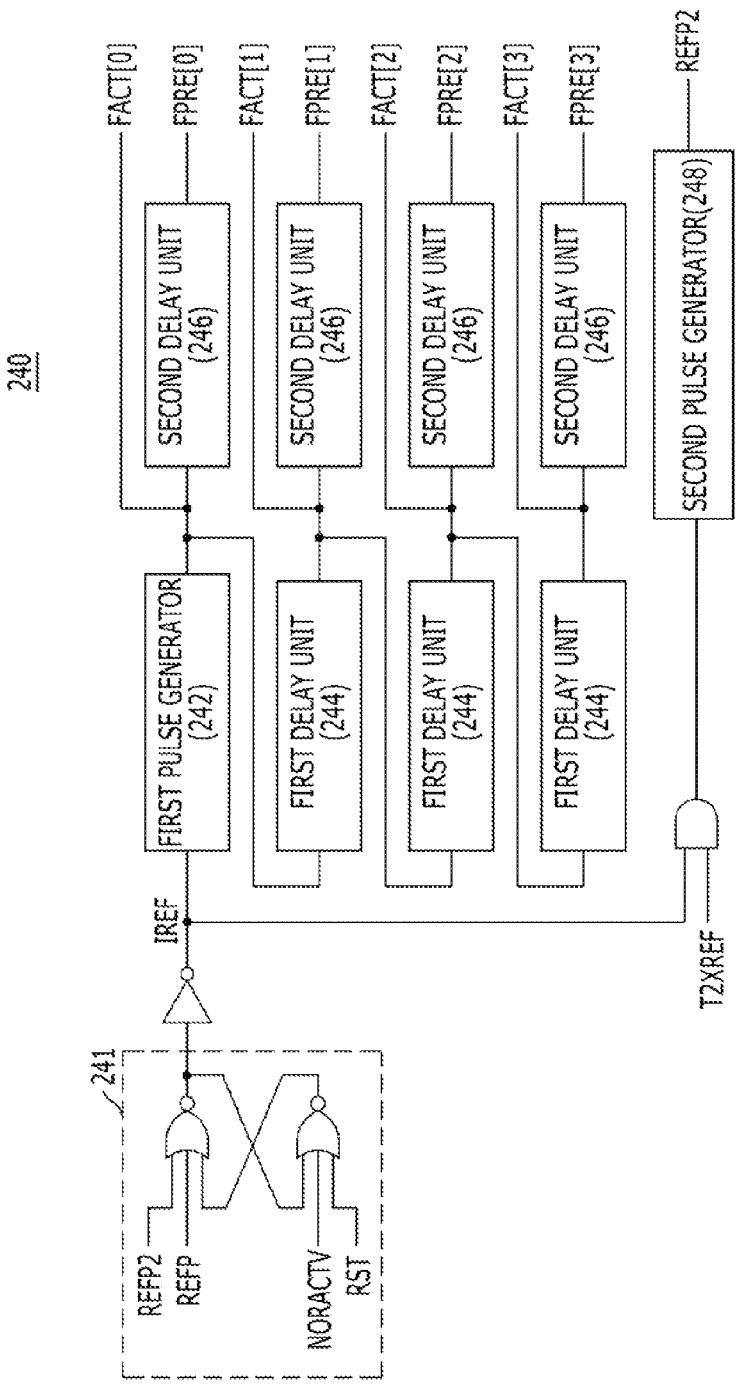
FIG. 6 is a detailed block diagram illustrating a refresh control block shown in FIG. 2.

FIG. 6 is a detailed block diagram illustrating the refresh control block 240 shown in FIG. 2.

Referring to FIG. 6, the refresh control block 240 includes a refresh operation signal generation unit 241, a first pulse generator 242, a second pulse generator 248, first delay units 244, and second delay units 246.

The refresh operation signal generation unit 241 activates the refresh operation signal IREF in response to the refresh command REFP or an additional refresh command REFP2, and deactivates the refresh operation signal IREF in response to an active period signal NORACTV or the reset signal RST. The active period signal NORACTV is a signal to define a minimum activation period of the refresh operation signal IREF.

The first pulse generator 242 toggles a first bit FACT[0] of the refresh active command FACT[3:0] in response to an activation of the refresh operation signal IREF.

The first delay units 244 sequentially outputs the remaining bits FACT[3:1] of the refresh active command FACT[3:0] with a first preset time difference in response to the toggling of the first bit FACT[0] of the refresh active command FACT[3:0]. The first preset time difference may be controlled by a delay amount of each of the first delay units 244.

The second delay units 246 sequentially output the refresh precharge command FPRE[3:0] with a second preset time difference in response to the toggling of the first bit FACT[0] of the refresh active command FACT[3:0]. The second preset time difference may be controlled by a delay amount of each of the second delay units 246 in addition to the delay amount of each of the first delay units 244.

The second pulse generator 248 generates the additional refresh command REFP2 in response to the refresh operation signal IREF when the additional refresh signal T2XREF is activated, and does not generate the additional refresh command REFP2 regardless of the refresh operation signal IREF when the additional refresh signal T2XREF is deactivated. The additional refresh command REFP2 is generated after the refresh active command FACT[3:0] and the refresh precharge command FPRE[3:0] have toggled once in response to the activation of the refresh operation signal IREF. In particular, the second pulse generator 248 activates the additional refresh command REFP2 when the refresh operation signal IREF transitions from an activated state to a deactivated state.

Furthermore, when the refresh operation signal IREF is activated in response to the refresh command REFP, the first pulse generator 242 and the first delay units 244 sequentially toggle the refresh active command FACT[3:0], and at the same time, the second delay units 246 sequentially toggle the refresh precharge command FPRE[3:0]. As the refresh active command FACT[3:0] and the refresh precharge command FPRE[3:0] toggle, all of the first to fourth bank groups BG0 to BG3 may be selected, activated and precharged. Further, aside from the operation of activating the refresh operation signal IREF in response to the refresh command REFP, the refresh operation signal generation unit 241 reactivates the refresh operation signal IREF in response to the additional refresh command REFP2 generated by the second pulse generator 248. Accordingly, the refresh operation signal IREF is consecutively activated twice in response to one refresh command REFP.

Since the additional refresh command REFP2 is generated by the second pulse generator 248 when the refresh operation signal IREF transitions from the activated state to the deactivated state, the activation number of the refresh operation signal IREF in response to one activation of the refresh command REFP may be two or more. That is, in response to one activation of the refresh command REFP, it is possible to toggle the refresh active command FACT[3:0] and the refresh precharge command FPRE[3:0] at least twice.

Figure 7:
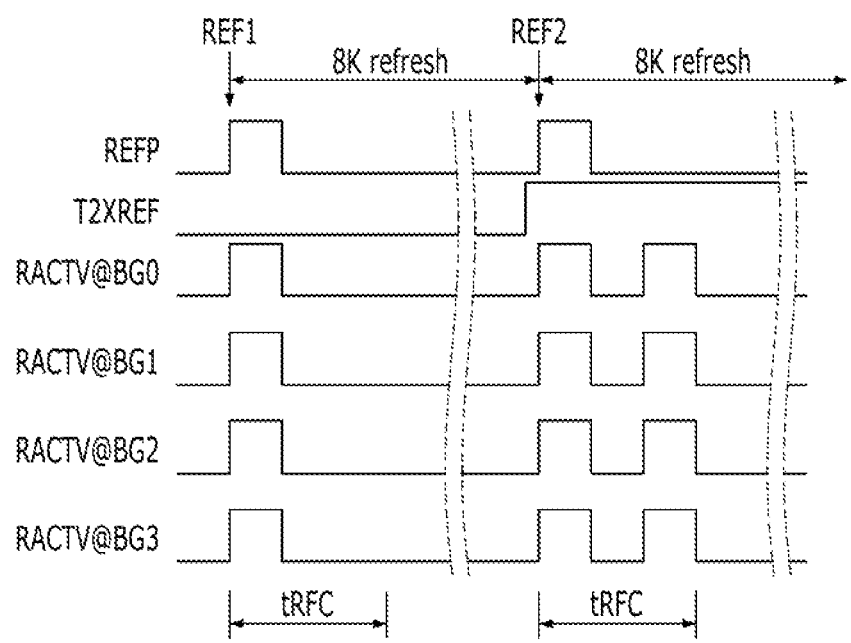
FIG. 7 is a timing diagram explaining a refresh operation of the semiconductor memory device shown in FIG. 2.

FIG. 7 is a timing diagram describing a refresh operation of the semiconductor memory device shown in FIG. 2.

Referring to FIG. 7, it may be seen that the number of refreshes to be performed in response to the refresh command REFP varies according to whether or not the additional refresh signal T2XREF is activated.

First, the active signals RACTV[15:0] may be toggled in units of the bank groups BG0 to BG3, in response to a first input REF1 corresponding to the refresh command REFP. Since the additional refresh signal T2XREF is in a deactivated state, an additional operation for toggling the active signals RACTV[15:0] is not performed.

Then, the active signals RACTV[15:0] may be toggled in units of the bank groups BG0 to BG3, in response to a second input REF2 corresponding to the refresh command REFP. Since the additional refresh signal T2XREF is in an activated state, the active signals RACTV[15:0] respectively toggle one more time in units of the bank groups BG0 to BG3. That is, due to the activated state of the additional refresh signal T2XREF, refresh operations for the first to fourth bank groups BG0 to BG3 are performed twice in response to one refresh command REFP.

Through the refresh operations of the semiconductor memory device described above with reference to FIGS. 2 to 7, the additional refresh operations may be performed along with the refresh operations performed in response to the refresh command REFP. That is, when the activation number or the activation frequency of a semiconductor memory device is larger or higher, the number of refresh operations performed in response to the refresh command REFP may increase by activating the additional refresh signal T2XREF. Accordingly, it is possible to prevent the data of memory cells from being degraded due to word line disturbance.

Figure 8:
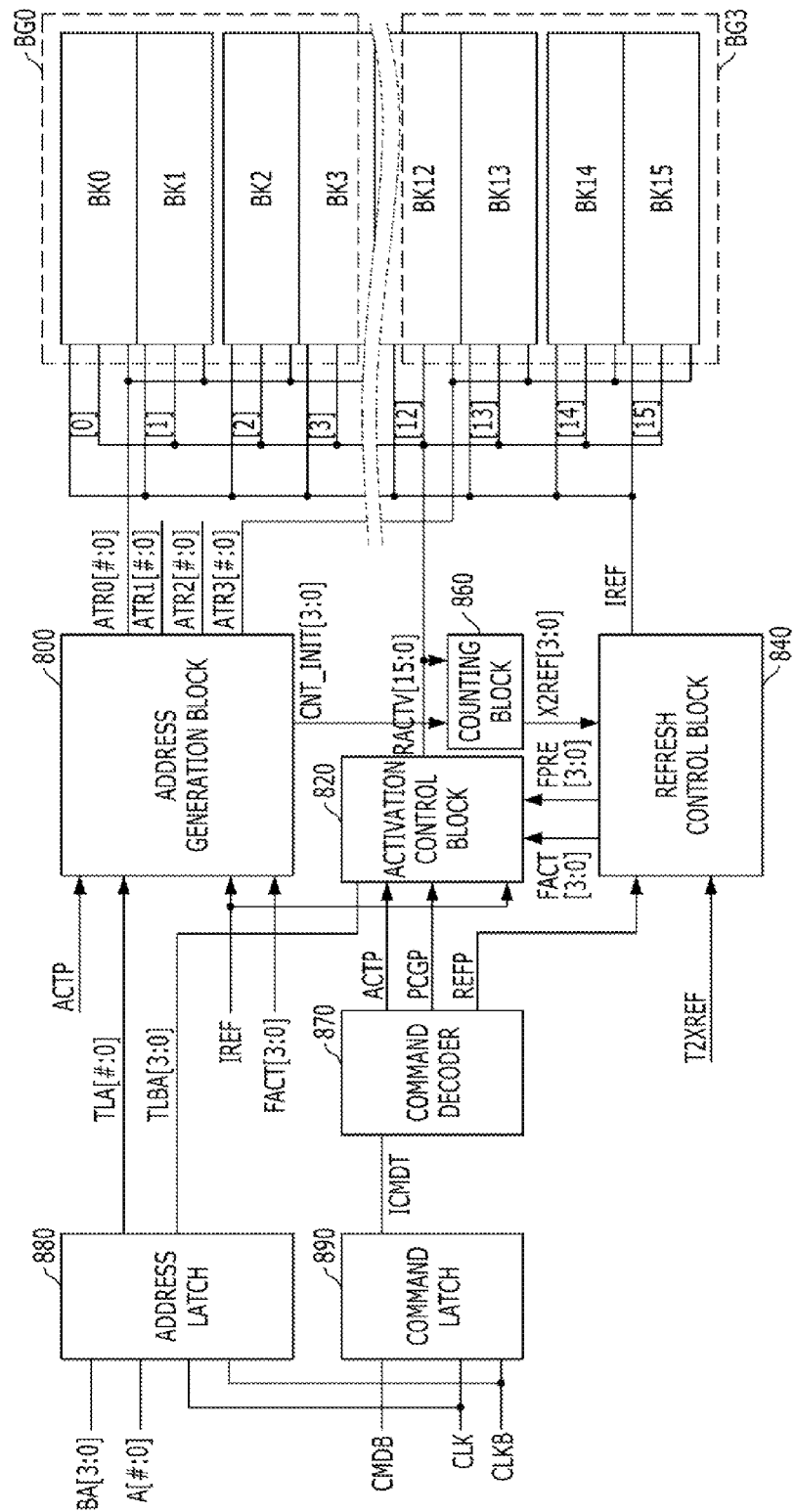
FIG. 8 is a block diagram illustrating a semiconductor memory device in accordance with an exemplary embodiment of the present invention.

FIG. 8 is a block diagram illustrating a semiconductor memory device in accordance with an exemplary embodiment of the present invention.

Referring to FIG. 8, the semiconductor memory device in accordance with the exemplary embodiment of the present invention includes first to fourth bank groups BG0 to BG3, an address generation block 800, an activation control block 820, a refresh control block 840, a counting block 860, a command decoder 870, an address latch 880, and a command latch 890.

Respective fours of banks BK0, BK1, BK2, BK3, . . . , BK12, BK13, BK14 and BK15 are included in the respective bank groups BG0 to BG3. That is, the first to fourth bank groups BG0 to BG3 are defined by dividing 16 banks BK0, BK1, BK2, BK3, . . . , BK12, BK13, BK14 and BK15 by 4. For reference, the 16 banks in the drawing are shown for illustration purposes; however, more or less banks may be included in the back groups. The first to fourth bank groups which are defined by grouping 16 banks into 4 bank groups are shown for illustration purposes, however, more or less banks may be included in 1 bank group, therefore the number of bank groups may be changed in a variety of ways. For reference, in the exemplary embodiment of the semiconductor memory device, it is presumed that, as shown in FIG. 8, the first to fourth bank groups BG0 to BG3 are defined in units of 4 banks, and thus total 16 banks BK0, BK1, BK2, BK3, . . . , BK12, BK13, BK14 and BK15 are disposed in the first to fourth bank groups BG0 to BG3.

Clock signals CLK and CLKB inputted from outside of the semiconductor memory device are buffered and are outputted to the command latch 890 and the address latch 880.

The address latch 880 buffers and latches a bank address BA[3:0] and a row address A[#:0] inputted from the outside of the semiconductor memory device in response to the clock signals CLK and CLKB, and outputs a bank address TLBA [3:0] and a row address TLA[#:0].

The address generation block 800 receives the row address TLA[#:0], and selects a plurality of word lines (not shown) included in the 16 banks BK0 to BK15 based on the row address TLA[#:0]. The address generation block 800 receives the bank address TLBA[3:0], and selects any one of the 16 banks BK0 to BK15 based on the bank address TLBA[3:0].

The command latch 890 buffers and latches a command signal CMDB inputted from the outside of the semiconductor memory device in response to the clock signals CLK and CLKB, and outputs an Internal command signal ICMDT.

The command decoder 870 decodes the internal command signal ICMDT latched by the command latch 890, and generates an active command ACTP, a precharge command PCGP and a refresh command REFP.

The active command ACTP generated by the command decoder 870 is inputted to the activation control block 820 and the address generation block 800, and is used to activate the 16 banks BK0 to BK15. The precharge command PCGP is inputted to the activation control block 820, and is used to precharge the 16 banks BK0 to BK15. The refresh command REFP is inputted to the refresh control block 840, and is used to refresh the 16 banks BK0 to BK15.

The address generation block 800 generates internal row addresses ATR0[#:0], ATR1[#:0], ATR2[#:0] and ATR3[#:0] for selecting any one of the word lines included in each of the 16 banks BK0 to BK15 divided into the first to fourth bank groups BG0 to BG3, based on the row address TLA[#:0] when the active command ACTP is applied. Additionally, the address generation block 800 generates the internal row addresses ATR0[#:0], ATR1[#:0], ATR2[#:0] and ATR3[#:0] for selecting any one of the word lines included in each of the 16 banks BK0 to BK15 divided into the first to fourth bank groups BG0 to BG3, by internally generating addresses to be used to refresh when a refresh active command FACT[3:0] corresponding to the first to fourth bank groups BG0 to BG3 and the refresh command REFP is applied. Further, the address generation block 800 generates counting initialization signals CNT_INIT[3:0] to control an initialization operation for the counting block 860 when the input number of the refresh active command FACT[3:0] corresponding to the refresh command REFP reaches a predetermined number.

The activation control block 820 activates any one of the 16 banks BK0 to BK15 in response to the active command ACTP and the bank address TLBA[3:0], and precharges any one of the 16 banks BK0 to BK15 in response to the precharge command PCGP and the bank address TLBA[3:0]. Since a bank to be activated and a bank to be precharged are selected based on the same bank address TLBA[3:0], an active operation and a precharge operation are performed together on each bank. Further, the activation control block 820 activates the 16 banks BK0 to BK15 in units of the bank groups BG0 to BG3 in response to the refresh active command FACT[3:0], and precharges the 16 banks BK0 to BK15 in units of the bank groups BG0 to BG3 in response to a refresh precharge command FPRE[3:0]. Since the refresh active command FACT [3:0] and the refresh precharge command FPRE[3:0] are respectively activated in a preset order in response to the refresh command REFP, a refresh active operation and a refresh precharge operation are performed together on each bank. Further, the activation control block 820 may generate active signals RACTV[15:0] for determining whether to activate the respective 16 banks BK0 to BK15, to the counting block 860 so as to count the activation number of the respective 16 banks BK0 to BK15.

The counting block 860 sums and counts the 16 active signals RACTV[15:0] outputted from the activation control block 820 in units of the bank groups BG0 to BG3 to determine whether to activate the respective 16 banks BK0 to BK15, and outputs first to fourth determination signals X2REF[3:0]. That is, the counting block 860 sums and counts the activation number of the 4 respective banks BK0, BK1, BK2 and BK3 divided into the first bank group BG0 and determines the first determination signal X2REF[0], sums and counts the activation number of the 4 respective banks BK4, BK5, BK6 and BK7 divided into the second bank group BG1 and determines the second determination signal X2REF [1], sums and counts the activation number of the 4 respective banks BK8, BK9, BK10 and BK11 divided into the third bank group BG2 and determines the third determination signal X2REF[2], and sums and counts the activation number of the 4 respective banks BK12, BK13, BK14 and BK15 divided into the fourth bank group BG3 and determines the fourth determination signal X2REF[3]. The first to fourth determination signals X2REF[3:0] corresponding to the first to fourth bank groups BG0 to BG3 are transferred to the refresh control block 840 and are used to control an additional refresh operation.

The refresh control block 840 generates and outputs a refresh operation signal IREF to the 16 banks BK0 to BK15 and the address generation block 800 in response to the refresh command REFP, such that any one of the word lines included in each of the 16 banks BK0 to BK15 may be selected for a refresh operation. Additionally, the refresh control block 840 generates and outputs the refresh active command FACT[3:0] and the refresh precharge command FPRE [3:0] to the activation control block 820 in response to the refresh command REFP, such that the 16 banks BK0 to BK15 may be activated and precharged in units of the bank groups BG0 to BG3.

The number of times by which the refresh active command FACT[3:0] and the refresh precharge command FPRE[3:0]

are generated in response to one refresh command REFP may differ for the respective bank groups BG0 to BG3, in response to an additional refresh signal T2XREF and the first to fourth determination signals X2REF[3:0] which are applied to the refresh control block 840 from the counting block 860. For example, when the additional refresh signal T2XREF is deactivated, the refresh control block 840 generates the refresh active command FACT[3:0] and the refresh precharge command FPRE[3:0] once in response to one refresh command REFP regardless of the first to fourth determination signals X2REF[3:0], such that the 16 banks BK0 to BK15 may be activated and precharged once in units of the bank groups BG0 to BG3. Conversely, when the additional refresh signal T2XREF is activated, the refresh control block 840 generates the refresh active command FACT[3:0] and the refresh precharge command FPRE[3:0] at least twice in response to one refresh command REFP, for a bank group having a counting value more than or equal to a predetermined reference, such that 4 banks belonging to one bank group having the counting value more than or equal to the predetermined reference may be activated and precharged at least twice. When the additional refresh signal T2XREF is activated, the refresh control block 840 generates the refresh active command FACT[3:0] and the refresh precharge command FPRE[3:0] once in response to one refresh command REFP, for a bank group having a counting value less than the predetermined reference, such that 4 banks belonging to one bank group having the counting value less than the predetermined reference may be activated and precharged once.

Figure 9:
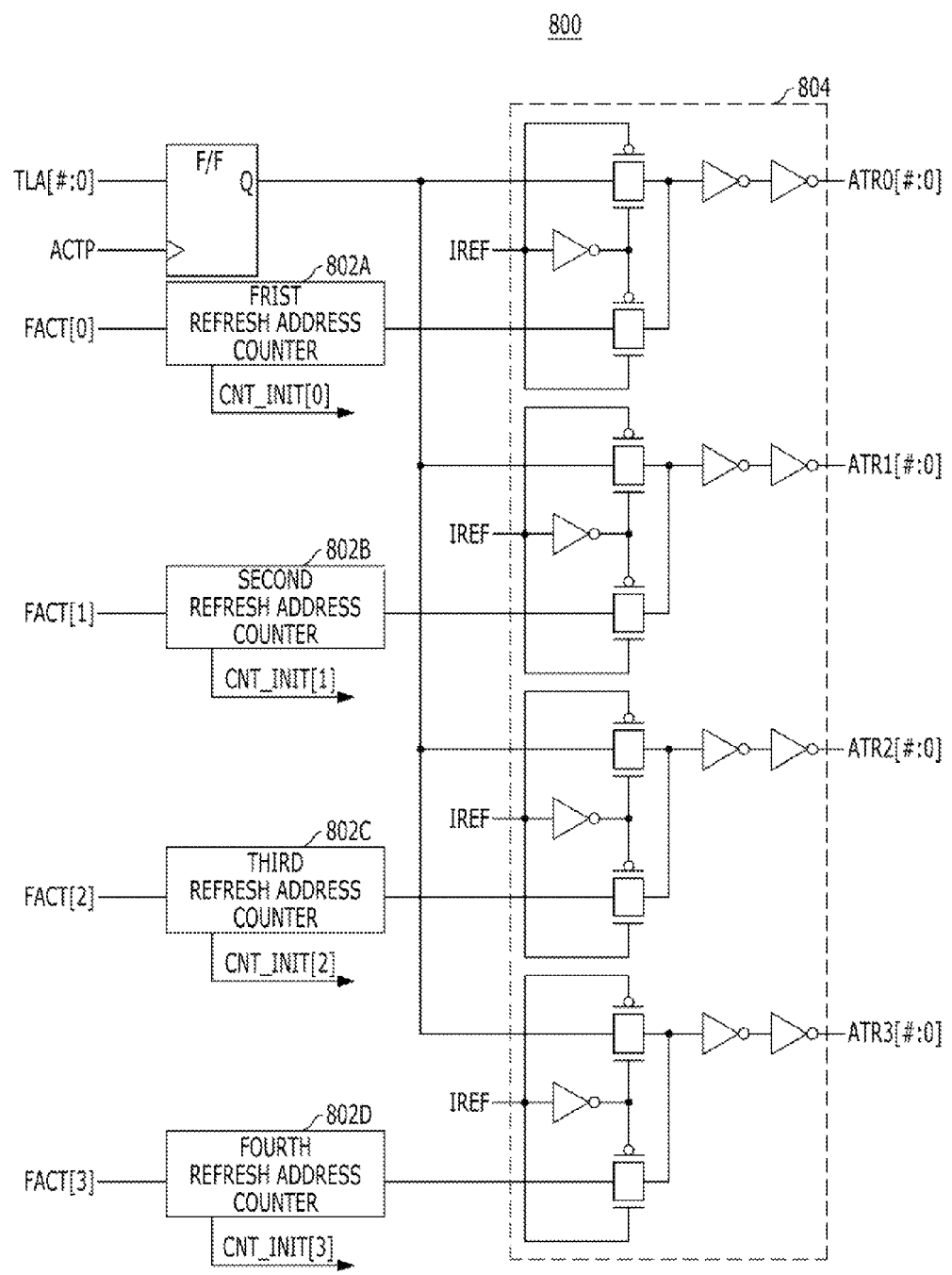
FIG. 9 is a detailed block diagram illustrating an address generation block shown in FIG. 8.

FIG. 9 is a detailed block diagram illustrating the address generation block 800 shown in FIG. 8.

Referring to FIG. 9, the address generation block 800 includes a flip-flop F/F, first to fourth refresh address counters 802A to 802D, and an address selection unit 804.

The flip-flop F/F receives the row address TLA[#:0] and outputs the internal row addresses ATR0[#:0], ATR1[#:0], ATR2[#:0] and ATR3[#:0] corresponding to the respective bank groups BG0 to BG3, in synchronization with the active command ACTP. That is, the flip-flop F/F outputs the row address TLA[#:0] as the internal row addresses ATR0[#:0], ATR1[#:0], ATR2[#:0] and ATR3[#:0] corresponding to the respective bank groups BG0 to BG3 when the active command ACTP is applied.

The first to fourth refresh address counters 802A to 802D count a refresh address to output the internal row addresses ATR0[#:0], ATR1[#:0], ATR2[#:0] and ATR3[#:0] corresponding to the respective bank groups BG0 to BG3 in response to the refresh active command FACT[3:0] corresponding to the refresh command REFP. The refresh address is set in the first to fourth refresh address counters 802A to 802D in advance. That is, the first to fourth refresh address counters 802A to 802D output the Internal row addresses ATR0[#:0], ATR1[#:0], ATR2[#:0] and ATR3[#:0] having values that are sequentially generated, by performing a counting operation when the refresh active command FACT[3:0] each bit of which corresponds to the respective bank groups BG0 to BG3 in response to the refresh command REFP, are respectively applied. Moreover, the first to fourth refresh address counters 802A to 802D generate the counting initialization signals CNT_INIT[3:0] for initializing the counting block 860 when the input number of the refresh active command FACT[3:0] reaches a predetermined number. The predetermined number may be 8K, for example. That is, the predetermined number means the input number of the refresh command REFP that is needed to perform one cycle of a normal refresh operation.

The address selection unit 804 selects one of the internal row addresses ATR0[#:0], ATR1[#:0], ATR2[#:0] and ATR3[#:0] outputted from the flip-flop F/F, and the internal row addresses ATR0[#:0], ATR1[#:0], ATR2[#:0] and ATR3[#:0] generated by the first to fourth refresh address counters 802A to 802D, in response to the refresh operation signal IREF corresponding to the refresh command REFP. That is, when a refresh operation is to be performed when the refresh operation signal IREF corresponding to the refresh command REFP is applied, the address selection unit 804 selects and outputs the internal row addresses ATR0[#:0], ATR1[#:0], ATR2[#:0] and ATR3[#:0] generated by the refresh address counters 802. In a normal operation period in which the refresh operation signal IREF corresponding to the refresh command REFP is not applied, the address selection unit 804 selects and outputs the internal row addresses ATR0[#:0], ATR1[#:0], ATR2[#:0] and ATR3[#:0] outputted from the flip-flop F/F.

Figure 10:
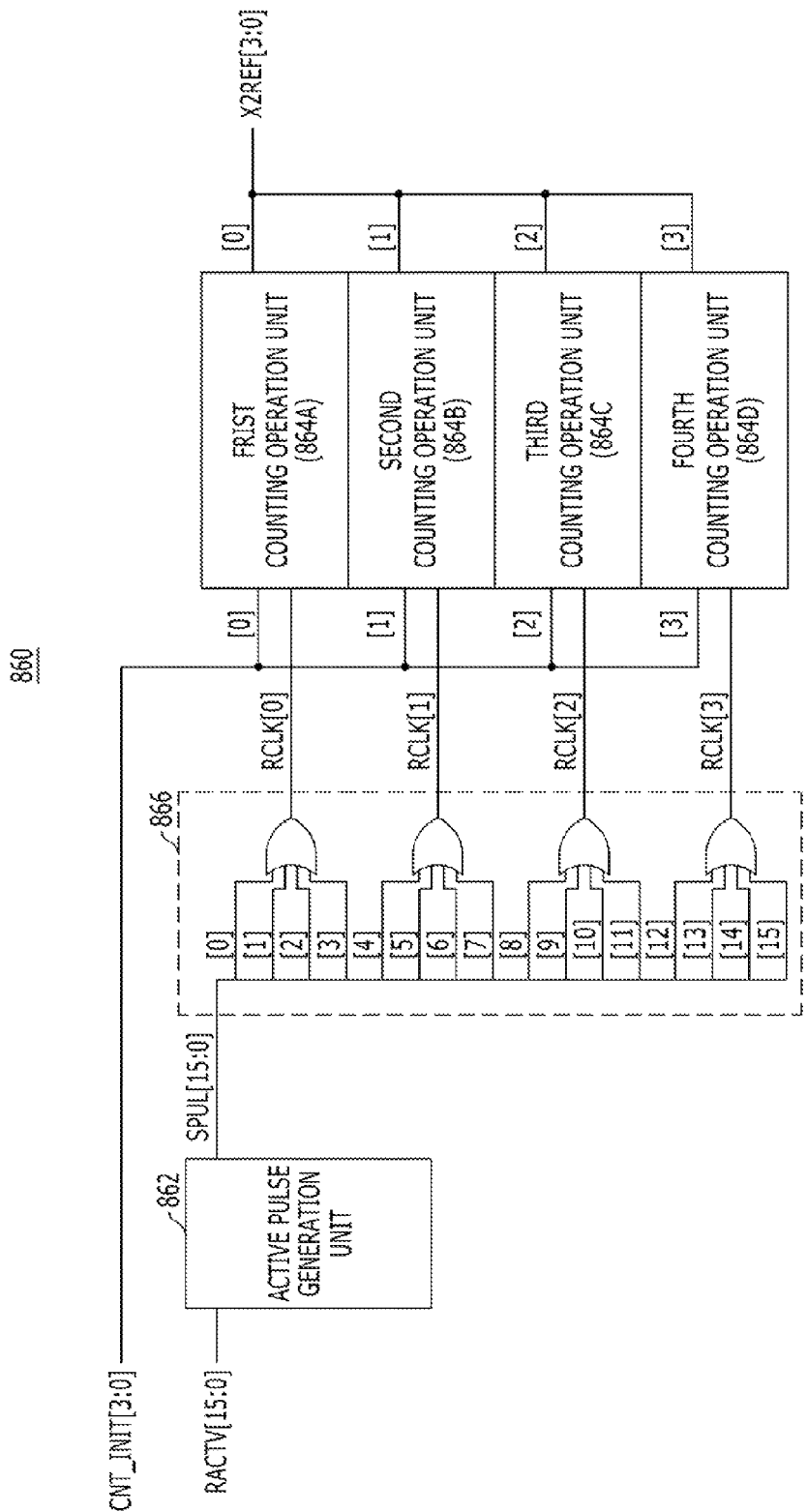
FIG. 10 is a detailed block diagram illustrating a counting block shown in FIG. 8.

FIG. 10 is a detailed block diagram illustrating the counting block 860 shown in FIG. 8.

Referring to FIG. 10, the counting block 860 includes an active pulse generation unit 862, first to fourth counting operation units 864A to 864D, and a pulse separation unit 866.

The active pulse generation unit 862 receives the 16 active signals RACTV[15:0] for respectively activating the 16 banks BK0 to BK15, and toggles 16 active pulses SPUL[15:0]. That is, a width of each activation period of the 16 active signals RACTV[15:0] that corresponds to a width of an activation period of the active command ACTP is relatively long and is not suitable for a counting operation. Therefore, the active pulse generation unit 862 generates the 16 active pulses SPUL[15:0] which toggle for a relatively short period in response to the activation of the 16 active signals RACTV[15:0]. For reference, the 16 active signals RACTV[15:0] and the 16 active pulses SPUL[15:0] correspond one to one. That is, the first active pulse SPUL[0] toggles in response to the activation of the first active signal RACTV[0], and the fourth active pulse SPUL[3] toggles in response to the activation of the fourth active signal RACTV[3].

The pulse separation unit 866 generates first to fourth group active pulses RCLK[3:0] each corresponding to the first to fourth bank groups BG0 to BG3, in response to the 16 active pulses SPUL[15:0]. For example, the first group active pulse RCLK[0] toggles when the 4 active pulses SPUL[3:0] corresponding to the first bank group BG0 toggle. The second group active pulse RCLK[1] toggles when the 4 active pulses SPUL[7:4] corresponding to the second bank group BG1 toggle. The third group active pulse RCLK[2] toggles when the 4 active pulses SPUL[11:8] corresponding to the third bank group BG2 toggle. The fourth group active pulse RCLK[3] toggles when the 4 active pulses SPUL[15:12] corresponding to the fourth bank group BG3 toggle.

The counting operation units 864A to 864D count the toggling number of the respective group active pulses RCLK[3:0], and generate the first to fourth determination signals X2REF[3:0] based on counting results. When the toggling number of the second group active pulse RCLK[1] is more than or equal to a predetermined number, the second determination signal X2REF[1] is activated while the remaining determination signals X2REF[3], X2REF[2] and X2REF[0] are deactivated. When the toggling numbers of the second group active pulse RCLK[1] and the third group active pulse RCLK[2] are more than or equal to the predetermined number, the second determination signal X2REF[1] and the third determination signal X2REF[2] are activated while the remaining determination signals X2REF[3] and X2REF[0] are deactivated.

The counting results of the counting operation units 864A to 864D are initialized when the counting initialization signals CNT_INIT[3:0] toggle. That is, the counting operation units 864A to 864D perform a counting operation during a period beginning after the counting initialization signals CNT_INIT[3:0] toggle until the counting initialization signals CNT_INIT[3:0] toggle again. Since the counting initialization signals CNT_INIT[3:0] are signals which toggle when one cycle of the normal refresh operation is performed, the counting operation units 864A to 864D determine whether the activation number of the first to fourth bank groups BG0 to BG3 exceeds a given number, during every one cycle of the normal refresh operation. That is, the counting operation units 864A to 864D repeatedly count the activation number of the first to fourth bank groups BG0 to BG3 on the basis of one cycle of the normal refresh operation. Accordingly, a bank group whose activation number exceeds the given number means that the activation number of the bank group has exceeded a reference number during one cycle of the normal refresh operation.

In the case of the bank group whose activation number exceeds the given number, the bank group may operate in a first mode in a manner that the determination signal corresponding to the bank group continuously retains an activated state while one cycle of the normal refresh operation is repeated a predetermined number after the determination signal is activated, or may operate in a second mode in a manner that the determination signal corresponding to the bank group is deactivated in response to ending of one cycle of the normal refresh operation after the determination signal is activated. In the first mode, the operation of the counting operation units 864A to 864D to determine whether the activation number exceeds the given number by counting the activation number of the first to fourth bank groups BG0 to BG3 is separated from the operation of the counting operation units 864A to 864D to control whether to initialize the determination signal for the bank group whose activation number exceeds the given number. Conversely, in the second mode, the operation of the counting operation units 864A to 864D to determine whether the activation number exceeds the given number by counting the activation number of the first to fourth bank groups BG0 to BG3 is not separated from the operation of the counting operation units 864A to 864D to control whether to initialize the determination signal for the bank group whose activation number exceeds the given number.

Figure 11:
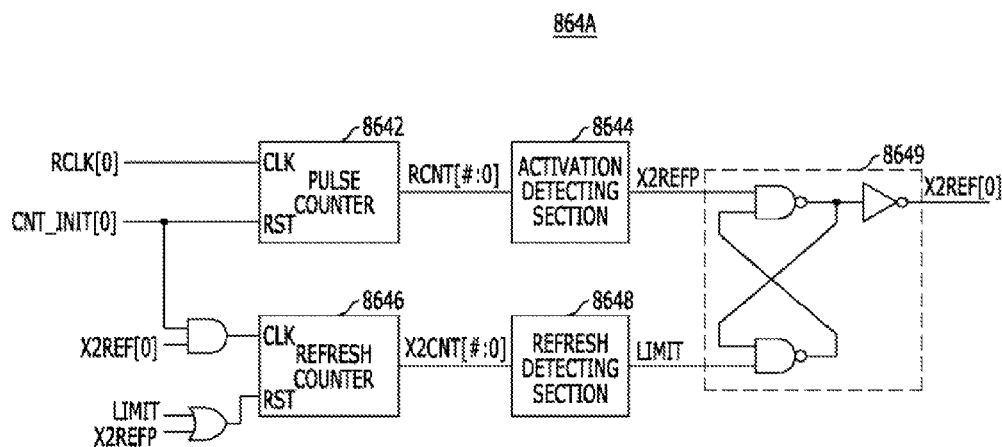
FIGS. 11 and 12 are detailed block diagrams illustrating each counting operation unit shown in FIG. 10.
Figure 12:
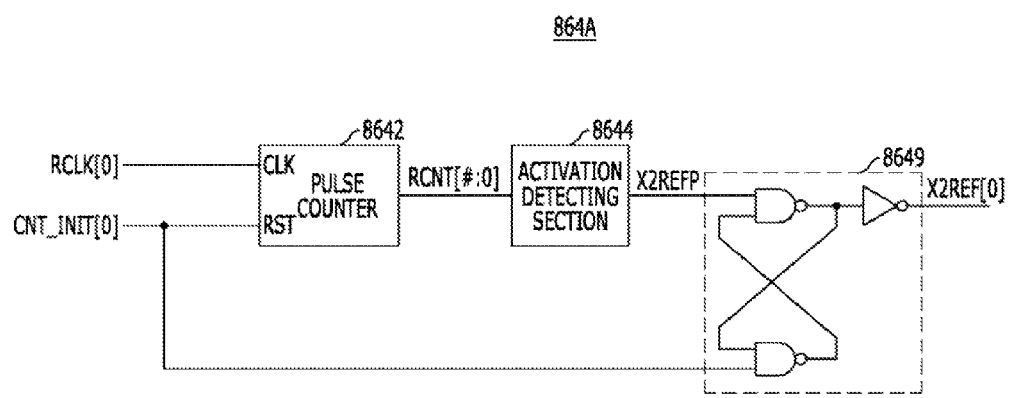

FIGS. 11 and 12 are detailed block diagrams illustrating the first counting operation unit 864A shown in FIG. 10. Particularly, FIG. 11 illustrates the first counting operation unit 864A in the first mode, and FIG. 12 illustrates the first counting operation unit 864A in the second mode. Since the second to fourth counting operation units 864B to 864D have substantially the same structures as that of the first counting operation unit 864A, the first counting operation unit 864A is described in FIGS. 11 and 12 as an example.

Referring to FIG. 11, the first counting operation unit 864A includes a pulse counter 8642, an activation detecting section 8644, a refresh counter 8646, a refresh detecting section 8648, and a determination signal output section 8649.

The pulse counter 8642 counts the toggling number of the first group active pulse RCLK[0], and outputs a value RCNT[#:0]. The pulse counter 8642 is initialized in response to a corresponding counting initialization signal CNT_INIT[0].

The activation detecting section 8644 determines whether to toggle a determination pulse X2REFP in response to whether the value RCNT[#:0] is larger than or equal to a predetermined value.

The refresh counter 8646 counts the toggling number of the corresponding counting initialization signal CNT_INIT[0] during a period in which a corresponding determination signal X2REF[0] is activated, and outputs a value X2CNT[#:0]. Since the counting initialization signal CNT_INIT[0] toggles every one cycle of the normal refresh operation, the number counted by the refresh counter 8646 represents a number that indicates how many times one cycle of the normal refresh operation is repeated. The refresh counter 8646 is initialized in response to the determination pulse X2REFP or a limit signal LIMIT which is outputted from the refresh detecting section 8648.

The refresh detecting section 8648 determines whether to toggle the limit signal LIMIT in response to whether the value X2CNT[#:0] is larger than or equal to a predetermined value. That is, the refresh detection section 8648 toggles the limit signal LIMIT when one cycle of the normal refresh operation is repeated a predetermined number.

The determination signal output section 8649 activates the corresponding determination signal X2REF[0] in response to toggling of the determination pulse X2REFP and deactivates the corresponding determination signal X2REF[0] in response to toggling of the limit signal LIMIT.

In summary, in the first mode, since the refresh counter 8646 is initialized in response to toggling of the limit signal LIMIT, when one cycle of the normal refresh operation is repeatedly performed the predetermined number after the corresponding determination signal X2REF[0] is activated, the refresh counter 8646 and the refresh detecting section 8648 deactivate the corresponding determination signal X2REF[0], and the refresh counter 8646 is initialized.

Additionally, since the refresh counter 8646 is initialized in response to toggling of the determination pulse X2REFP, the refresh counter 8646 is initialized when the value RCNT[#:0] is larger than or equal to the predetermined value. This means that the refresh counter 8646 is initialized when the value RCNT[#:0] is larger than or equal to the predetermined value, regardless of the fact that the corresponding determination signal X2REF[0] retains the activated state or the deactivated state, and a subsequent operation is performed.

Referring to FIG. 12, in the second mode where the first counting operation unit 864A operates in such a manner that the time when the activated determination signal X2REF[0] is deactivated corresponds to the time when one cycle of the normal refresh operation is ended, the refresh counter 8646 and the refresh detecting section 8648 may be omitted, and the determination signal output section 8649 may receive the counting initialization signal CNT_INIT instead of the limit signal LIMIT.

Figure 13:
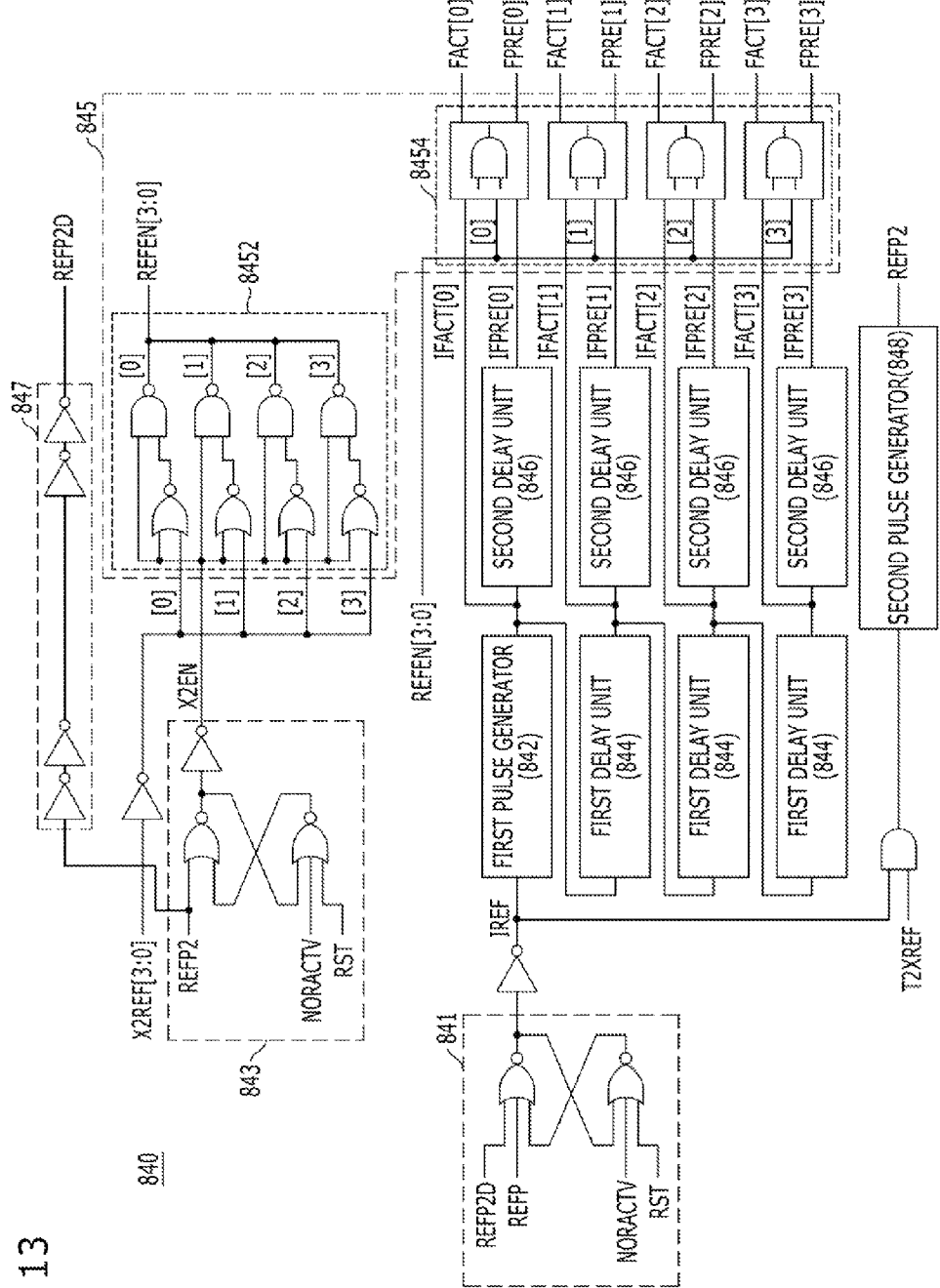
FIG. 13 is a detailed block diagram illustrating a refresh control block shown in FIG. 8.

FIG. 13 is a detailed block diagram illustrating the refresh control block 840 shown in FIG. 8.

Referring to FIG. 13, the refresh control block 840 includes a normal refresh control circuit 841, 842, 844, 846 and 848 suitable for performing a normal refresh operation on a plurality of banks or bank groups in response to the refresh command REFP, and an additional refresh control circuit 843, 845 and 847 suitable for performing an additional refresh operation on a selected bank or bank group whose activation number exceeds a given number, in response to the determination signals X2REF[3:0] after the normal refresh operation. In detail, the normal refresh control circuit may include a refresh operation signal generation unit 841, a first pulse generator 842, first delay units 844, second delay units 846 and a second pulse generator 848. The additional refresh control circuit may include a refresh additional operation signal generation unit 843, a refresh selecting operation unit 845, and an additional refresh command delay unit 847.

The refresh operation signal generation unit 841 activates the refresh operation signal IREF in response to the refresh command REFP or a delayed additional refresh command REFP2D, and deactivates the refresh operation signal IREF in response to an active period signal NORACTV or a reset signal RST. The active period signal NORACTV is a signal to define a minimum activation period of the refresh operation signal IREF.

The first pulse generator 842 toggles a first bit IFACT[0] of a refresh pre-active command IFACT[3:0] in response to the activation of the refresh operation signal IREF.

The first delay units 844 sequentially outputs the remaining bits IFACT[3:1] of the refresh pre-active command IFACT[3: 0] with a first preset time difference in response to the toggling of the first bit IFACT[0] of the refresh pre-active command IFACT[3:0]. The first preset time difference may be controlled by a delay amount of each of the first delay units 844.

The second delay units 846 sequentially outputs a refresh pre-precharge command IFPRE[3:0] with a second preset time difference in response to the toggling of the first bit IFACT[0] of the refresh pre-active command IFACT[3:0]. The second preset time difference may be controlled by a delay amount of each of the second delay units 846 in addition to the delay amount of each of the first delay units 244.

The second pulse generator 848 generates an additional refresh command REFP2 in response to the refresh operation signal IREF when the additional refresh signal T2XREF is activated, and does not generate the additional refresh command REFP2 regardless of the refresh operation signal IREF when the additional refresh signal T2XREF is deactivated. The additional refresh command REFP2 is generated after the refresh active command FACT[3:0] and the refresh precharge command FPRE[3:0] have toggled once in response to the activation of the refresh operation signal IREF. In particular, the second pulse generator 848 activates the additional refresh command REFP2 when the refresh operation signal IREF transitions from an activated state to a deactivated state.

The refresh additional operation signal generation unit 843 activates an additional refresh enable signal X2EN in response to the additional refresh command REFP2 and deactivates the additional refresh enable signal X2EN in response to the active period signal NORACTV or the reset signal RST.

The refresh selecting operation unit 845 selects a bank group for which an additional refresh operation is to be performed, among the first to fourth bank groups BG0 to BG3 in response to the first to fourth determination signals X2REF [3:0]. The refresh selecting operation unit 845 includes an enable selecting section 8452 and a refresh operation selecting section 8454. The enable selecting section 8452 determines whether to activate refresh operation enable signals REFEN[3:0] in response to the additional refresh enable signal X2EN and the first to fourth determination signals X2REF [3:0]. The refresh operation selecting section 8454 selectively outputs the refresh pre-active command IFACT[3:0] and the refresh pre-precharge command IFPRE[3:0] as the refresh active command FACT[3:0] and the refresh precharge command FPRE[3:0] in response to the refresh operation enable signals REFEN[3:0].

In the second mode of the first counting operation unit 864A shown in FIG. 12, the first to fourth determination signals X2REF[3:0] are always initialized when one cycle of the normal refresh operation is ended. Conversely, in the first mode of the first counting operation unit 864A shown in FIG. 11, a determination signal X2REF activated among the first to fourth determination signals X2REF[3:0] is initialized when one cycle of the normal refresh operation is repeated the predetermined number. In this case, since times at which the respective determination signals X2REF[3:0] are activated may differ from one another, times at which the respective determination signals X2REF[3:0] are deactivated may differ from one another as well.

The additional refresh command delay unit 847 delays the additional refresh command REFP2 by a delay amount acquired through summing the operation delay amount of the refresh additional operation signal generation unit 843 and the operation delay amount of the refresh selecting operation unit 845, and outputs the delayed additional refresh command REFP2D. That is, the additional refresh command delay unit 847 makes an output timing of the delayed additional refresh command REFP2D and an output timing of the refresh operation enable signals REFEN[3:0] correspond to each other.

An operation of the refresh control block 840 will be described below with reference to the above-described configuration.

First, when the refresh operation signal IREF is activated in response to the refresh command REFP, the first pulse generator 842 and the first delay units 844 sequentially toggle the refresh pre-active command IFACT[3:0], and at the same time, the second delay units 846 sequentially toggle the refresh pre-precharge command IFPRE[3:0]. At this time, since the additional refresh command REFP2 is deactivated, the refresh operation enable signals REFEN[3:0] are all in an activated state. Accordingly, the refresh pre-active command IFACT[3:0] and the refresh pre-precharge command IFPRE [3:0] are outputted as the refresh active command FACT[3:0] and the refresh precharge command FPRE[3:0]. In response to that the refresh active command FACT[3:0] and the refresh precharge command FPRE[3:0] toggle, all of the first to fourth bank groups BG0 to BG3 may be respectively selected, activated and precharged.

Thereafter, the second pulse generator 848 operates to activate the additional refresh command REFP2 in response to the refresh operation signal IREF transitioning from the activated state to the deactivated state. The refresh operation signal IREF may be activated once again even though the refresh command REFP retains the deactivated state after being activated once. That is, as the delayed additional refresh command REFP2D toggles after a time has passed by the delay amount of the additional refresh command delay unit 847 from the time when the additional refresh command REFP2 toggled, the refresh operation signal IREF may be activated once again even though the refresh command REFP retains the deactivated state after being activated once. Accordingly, the first pulse generator 842 and the first delay units 844 sequentially toggle the refresh pre-active command IFACT[3:0], and at the same time, the second delay units 846 sequentially toggle the refresh pre-precharge command IFPRE[3:0]. At this time, since the additional refresh command REFP2 is activated, the refresh operation enable signals REFEN[3:0] determined in response to the first to fourth determination signals X2REF[3:0]. In response to the refresh operation enable signals REFEN[3:0], the refresh pre-active command IFACT[3:0] and the refresh pre-precharge command IFPRE[3:0] are selectively outputted as the refresh active command FACT[3:0] and the refresh precharge command FPRE[3:0]. While a part IFACT[x] and a part IFPRE[x] of the refresh pre-active command IFACT[3:0] and the refresh pre-precharge command IFPRE[3:0] are outputted as a refresh active command FACT[x] and a refresh precharge command FPRE[x] in response to the refresh operation enable signals REFEN[3:0], the remaining part IFACT[y] and the remaining part IFPRE[y] of the refresh pre-active command IFACT[3:0] and the refresh pre-precharge command IFPRE[3:0] are not outputted but blocked. Operations are performed in such a manner that only one part bank group BG[x] is selected, activated and precharged in response to that one part refresh active command FACT[x] and one part refresh precharge command FPRE[x], and the unselected remaining part bank group BG[y] is not activated and precharged.

In summary, the refresh operation signal IREF is consecutively activated twice in one part bank group BG[x] among the first to fourth bank groups BG0 to BG3 in response to one refresh command REFP. Hence, it may be seen that the refresh operation is performed twice in response to one refresh command REFP in one part bank group BG[x]. Conversely, the refresh operation signal IREF is activated only once in response to one refresh command REFP in the remaining part bank group BG[y] among the first to fourth bank groups BG0 to BG3. Accordingly, it may be seen that the refresh operation is performed once in response to one refresh command REFP in the remaining part bank group BG[y].

For reference, in the above-described operations, the value acquired by summing 'x' and 'y' will become 4 which are the same as the number of the entire bank groups. Moreover, since the second pulse generator 848 generates the additional refresh command REFP2 when the refresh operation signal IREF transitions from the activated state to the deactivated state, for one part bank group BG[x] among the first to fourth bank groups BG0 to BG3, the activation number of the refresh operation signal IREF in response to that the refresh command REFP is activated once, may be at least twice. That is, for one part bank group BG[x] among the first to fourth bank groups BG0 to BG3, it is possible to toggle the refresh active command FACT[3:0] and the refresh precharge command FPRE[3:0] at least twice in response to that the refresh command REFP is activated once.

Figure 14:
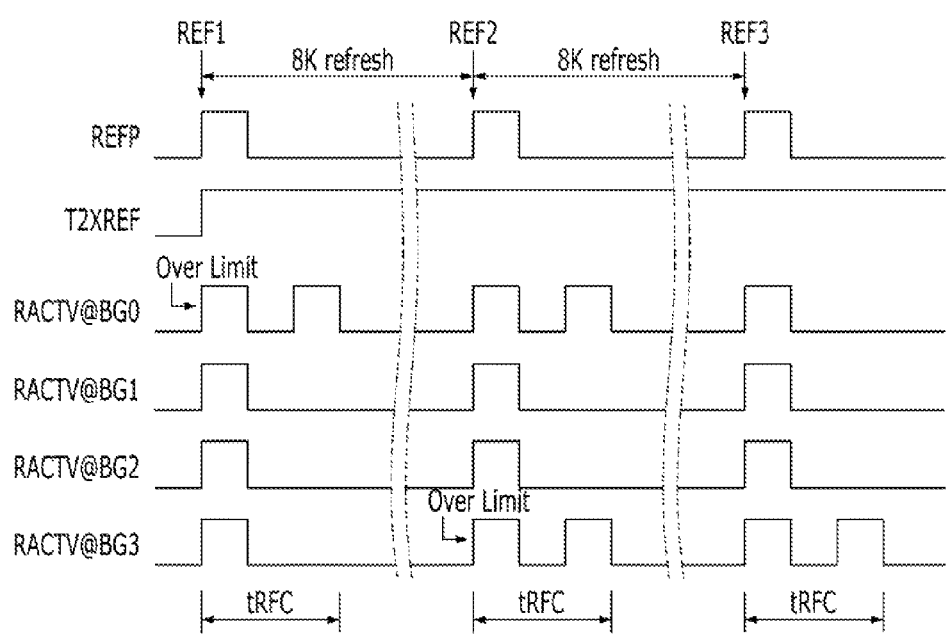
FIG. 14 is a timing diagram describing a refresh operation of the semiconductor memory device shown in FIG. 8.

FIG. 14 is a timing diagram describing a refresh operation of the semiconductor memory device shown in FIG. 8.

For reference, in the diagram shown in FIG. 14, the additional refresh signal T2XREF continuously retains the activated state. This is because only the normal refresh operation is performed and the additional refresh operation is not performed with the additional refresh signal T2XREF in the deactivated state in the operations shown in FIG. 14, as in the operations shown in FIG. 7.

Referring to FIG. 14, for one part bank groups BG0 and BG3 among the first to fourth bank groups BG0 to BG3, the number of refreshes to be performed in response to the refresh command REFP is changed due to an activation of the additional refresh signal T2XREF. Simultaneously, for the remaining part bank groups BG1 and BG2 among the first to fourth bank groups BG0 to BG3, the number of refreshes to be performed in response to the refresh command REFP is not changed regardless of the activation of the additional refresh signal T2XREF.

First, it may be seen that the active signals RACTV[15:0] respectively toggle in units of the bank groups BG0 to BG3, and the active signals RACTV[3:0] for the first bank group BG0 additionally toggle once more in response to a first input (REF1) of the refresh command REFP. This is because the activation number only for the first bank group BG0 among the first to fourth bank groups BG0 to BG3 was determined to be larger than or equal to a predetermined number.

Then, it may be seen that the active signals RACTV[15:0] respectively toggle in units of the bank groups BG0 to BG3, and the active signals RACTV[3:0] and RACTV[15:12] for the first bank group BG0 and the fourth bank group BG3 additionally toggle once more, in response to a second input (REF2) of the refresh command REFP. This is because, for the first bank group BG0, the activation number had already been determined to be larger than or equal to the predetermined number at the first input (REF1) of the previous refresh command REFP, and for the fourth bank group BG3, although the activation number had already been determined to be smaller than the predetermined number at the first input (REF1) of the refresh command REFP, the activation number was determined to be larger than or equal to the predetermined number at the second input (REF2) of the current refresh command REFP.

Successively, it may be seen that the active signals RACTV [15:0] respectively toggle in units of the bank groups BG0 to BG3, and the active signals RACTV[15:12] for the fourth bank group BG3 additionally toggle once more in response to a third input (REF3) of the refresh command REFP. This is because, for the first bank group BG0, the additional refresh operation was sufficiently performed and thus the counting of the activation number was initialized after the activation number had already been determined to be larger than or equal to the predetermined number at the first input (REF1) of the previous refresh command REFP, and for the fourth bank group BG3, the activation number had already been determined to be larger than or equal to the predetermined number.

For reference, while FIG. 14 illustrates that the counting of the activation number is initialized in response to the second input (REF2) corresponding to the refresh command REFP after the additional refresh operation was performed since the activation number of the first bank group BG0 had been determined to be larger than the predetermined number, this is only for illustration purposes, however, the counting of the activation number may be initialized after the additional refresh operation was performed twice or more since the activation number had been determined to be larger than the predetermined number.

It may be seen that, through the refresh operations of the semiconductor memory device described above with reference to FIGS. 8 to 14, the additional refresh operations may be performed along with the refresh operations performed in response to the refresh command REFP. That is, when the activation number or the activation frequency of a semiconductor memory device is large or high, the number of refresh operations performed in response to the refresh command REFP may be increased through a method of activating the additional refresh signal T2XREF. Accordingly, it is possible to prevent the data of memory cells from being degraded due to word line disturbance.

Further, the semiconductor memory device described above with reference to FIGS. 8 to 14 is configured such that the additional refresh operation is performed for the one part bank group BG[x] and is not performed for the remaining part bank group BG[y], when the additional refresh signal T2XREF is activated. That is, the additional refresh operation is performed for the one part bank group BG[x] of which the activation number or an activation frequency exceeds the predetermined number or a predetermined activation frequency, as the activation number or activation frequencies of the first to fourth bank groups BG0 to BG3 become different from one another, and is not performed for the remaining part bank group BG[y] of which the activation number or an activation frequency does not exceed the predetermined number or the predetermined activation frequency. As a consequence, while additionally consumed current may not be completely saved due to the additional refresh operation, it is possible to minimize the magnitude of the additionally consumed current.

While it was described in the above embodiment that the 16 banks BK0 to BK15 and the first to fourth bank groups BG0 to BG3 defined by grouping the 16 banks by 4 are included in the semiconductor memory device, this is because the exemplary embodiment was described for a semiconductor memory device which operates by the unit of a bank group, however, the exemplary embodiment of the present disclosure may be applied in any way, even in the case of a semiconductor memory device which includes not bank groups but only a plurality of banks.

Briefly, in the above-described embodiment of the present invention, by excluding the configuration in which the 16 banks BK0 to BK15 are divided into the first to fourth bank groups BG0 to BG3, a configuration may be applied in any way in which the activation number are counted for respective banks and the normal refresh operation and the additional refresh operation are performed for the respective banks according to counting results.

That is, a characterizing feature of the embodiments of the present invention may be applied in any way even in the case where the banks included in a semiconductor memory device are not divided into bank groups, therefore since concrete embodiments thereof may be anticipated by a person having ordinary knowledge in the art through the configuration shown in FIGS. 2 to 14, detailed descriptions thereof will be omitted herein.

Although various embodiments have been described for illustrative purposes, it will be apparent to those skilled in the art that various changes and modifications may be made without departing from the spirit and scope of the invention as defined in the following claims.

For example, positions and kinds of the logic gates and transistors exemplified in the above-described embodiment should be differently realized according to the polarities of the signals inputted thereto.

What is claimed is:

1. A semiconductor memory device comprising:
   a plurality of banks;
   a counting block suitable for counting the activation number of the respective banks, and selecting a bank of which the activation number is larger than or equal to a given number; and
   a refresh control block suitable for performing a normal refresh operation on the banks in response to a refresh command, and performing an additional refresh operation N times on the selected bank, N being a positive integer.

2. The semiconductor memory device according to claim 1, wherein the counting block comprises:
   an active pulse generation unit suitable for generating a plurality of active pulses, each of which is toggled in response to an active command for the respective banks;
   a plurality of pulse counters suitable for counting the toggling number of the respective active pulses; and
   a plurality of activation detecting sections suitable for detecting the counting number of the respective pulse counters, and generating a plurality of determination signals indicating whether or not the activation number of the respective banks exceeds the given number.

3. The semiconductor memory device according to claim 2, wherein the refresh control block comprises:
   a normal refresh control circuit suitable for performing the normal refresh operation on the banks in response to the refresh command; and
   an additional refresh control circuit suitable for performing the additional refresh operation on the selected bank N times in response to the determination signals after the normal refresh operation.

4. The semiconductor memory device according to claim 1, wherein the counting block initializes the counting of the activation number of the respective banks in response to the refresh command, and initializes the selecting of the bank when the input number of the refresh command inputted to the selected bank reaches a preselected number.

5. The semiconductor memory device according to claim 4, wherein the counting block comprises:
   an active pulse generation unit suitable for generating a plurality of active pulses, each of which is toggled in response to an active command for the respective banks;
   a plurality of pulse counters suitable for counting the toggling number of the respective active pulses, and being initialized in response to the refresh command;
   a plurality of activation detecting sections suitable for detecting the counting number of the respective pulse counters, and generating a plurality of determination signals indicating whether or not the activation number of the respective banks exceeds the given number;
   a plurality of refresh counters suitable for counting the input number of the refresh command inputted to the selected bank in response to the determination signals; and
   a plurality of refresh detecting sections suitable for detecting the counting number of the respective refresh counters based on the preselected number, and determining whether to initialize the respective determination signals.

6. The semiconductor memory device according to claim 5, wherein refresh counters corresponding to determination signals activated among the plurality of determination signals count the input number of the refresh command, and refresh counters corresponding to determination signals deactivated among the determination signals do not count the input number of the refresh command.

7. The semiconductor memory device according to claim 5, wherein the refresh control block comprises:
   a normal refresh control circuit suitable for performing the normal refresh operation on the banks in response to the refresh command; and
   an additional refresh control circuit suitable for performing the additional refresh operation on the selected bank N times in response to the determination signals after the normal refresh operation.

8. A semiconductor memory device comprising:
   M number of bank groups grouped by dividing K number of banks by a predefined number, M and K being a positive integer;
   a counting block suitable for counting and summing the activation number of the respective banks in units of the respective bank groups, and selecting a bank group whose activation number is larger than or equal to a predetermined number; and
   a refresh control block suitable for performing a normal refresh operation on the bank groups in response to a refresh command, and performing an additional refresh operation N times on the selected bank group, N being a positive integer.

9. The semiconductor memory device according to claim 8, wherein the counting block comprises:
   an active pulse generation unit suitable for generating K number of active pulses, each of which is toggled in response to an active command for the respective banks;

a pulse separation unit suitable for generating M number of group active pulses corresponding to the respective bank groups, in response to the active pulses;

M number of pulse counters suitable for counting the toggling number of the respective group active pulses; and M number of activation detecting sections suitable for detecting the counting number of the respective pulse counters, and generating M number of determination signals indicating whether or not the activation number of the respective bank groups exceeds the predetermined number.

10. The semiconductor memory device according to claim 9, wherein the refresh control block comprises:

a normal refresh control circuit suitable for performing the normal refresh operation on the bank groups in response to the refresh command; and an additional refresh control circuit suitable for performing the additional refresh operation on the selected bank group N times in response to the determination signals after the normal refresh operation.

11. The semiconductor memory device according to claim 8, wherein the counting block initializes the counting of the activation number of the respective bank groups in response to the refresh command, and initializes the selecting of the bank group when the input number of the refresh command inputted to the selected bank group reaches a preselected number.

12. The semiconductor memory device according to claim 11, wherein the counting block comprises:

an active pulse generation unit suitable for generating K number of active pulses, each of which is toggled in response to an active command for the respective banks;

a pulse separation unit suitable for generating M number of group active pulses corresponding to the respective bank groups, in response to the active pulses;

M number of pulse counters suitable for counting the toggling number of the respective group active pulses;

M number of activation detecting sections suitable for detecting the counting number of the respective pulse counters, and generating M number of determination signals indicating whether or not the activation number of the respective bank groups exceeds the predetermined number;

M number of refresh counters suitable for counting the input number of the refresh command inputted to the selected bank group, in response to the determination signals; and M number of refresh detecting sections suitable for detecting the counting number of the respective refresh counters based on the preselected number, and determining whether to initialize the respective determination signals.

13. The semiconductor memory device according to claim 12, wherein refresh counters corresponding to determination signals activated among the determination signals count the input number of the refresh command, and refresh counters corresponding to determination signals deactivated among the determination signals do not count the input number of the refresh command.

14. The semiconductor memory device according to claim 12, wherein the refresh control block comprises:

a normal refresh control circuit suitable for performing the normal refresh operation on the bank groups in response to the refresh command; and an additional refresh control circuit suitable for performing the additional refresh operation on the selected bank N times in response to the determination signals after the normal refresh operation.

* * * * *